HIGH SPEED INVERTER

Filed July 26, 1965

INVENTOR.
DANIEL R. BORROR
JAMES D. TROTTER
BY Jack M. Wiseman
ATTORNEY

United States Patent Office 3,393,325
Patented July 16, 1968

3,393,325
HIGH SPEED INVERTER

Daniel R. Borror, Santa Clara, and James D. Trotter, Sunnyvale, Calif., assignors to General Micro-Electronics Inc., Santa Clara, Calif., a corporation of Delaware Filed July 26, 1965, Ser. No. 474,693
5 Claims. (Cl. 307—205)

ABSTRACT OF THE DISCLOSURE

High speed inverter using inverter transistor in series with periodically-enabled load transistor with out-of-phase periodically enabled preload transistor in parallel with load transistor for precharging load capacitance so that conducting resistance of load transistor can be increased, thereby enabling inverter transistor to discharge load capacitance more rapidly.

The present invention relates in general to digital circuits, and more particularly to a logic circuit.

An object of the present invention is to provide a logic circuit in which the switching speed thereof is more rapid.

Another object of the present invention is to provide a logic circuit in which the power consumption is reduced.

Another object of the present invention is to provide a logic circuit that precharges a load or output capacitance to increase the switching speed of the logic circuit and to reduce the power consumption of the logic circuit.

Another object of the present invention is to provide a logic circuit in which a signal is transferred from one semiconductor chip to another through a printed circuit and the like and wherein the switching time is reduced and wherein the size of the load device of the transmitting circuit is reduced.

Other and further objects and advantages will be apparent to one skilled in the art from the following description taken in conjunction with the accompanying drawings, in which.

Figure 1:
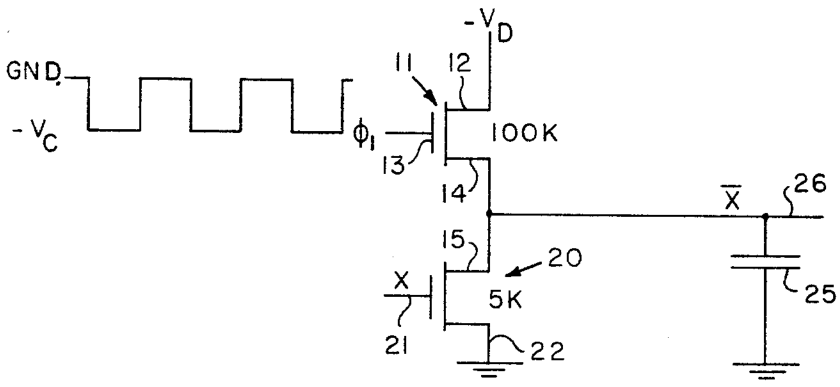
FIG. 1 is a diagrammatic illustration of a conventional inverter adaptable for use in a digital logic system.

Illustrated in FIG. 1 is a typical or conventional inverter adaptable for use in a digital clock dynamic logic system. The inverter circuit comprises a load metal oxide semiconductor transistor (MOST) or insulated gate field-effect transistor (IGFET) 11 having a drain electrode 12, a gate electrode and a source electrode 14. The drain electrode 12, is connected to a suitable source of voltage $-V_D$. The gate electrode 13 is connected to a source of clock synchronizing pulses $\phi_1$.

Connected to the source electrode 14 of transistor 11 is the drain electrode 15 of a logic data input transistor 20. Transistor 20 also includes a gate electrode 21 and a source electrode 22. The source electrode 22 is connected to ground and the gate electrode is connected to a source of a data input signal X. The source-to-drain circuits of transistors 11 and 20 are connected in series.

A capacitor 25, representative of the capacitance of a load or output circuit (not shown), has one side thereof connected to a junction between the source and drain electrodes 14 and 15 of transistor 20. The other side of capacitor 25 is connected to ground. Across the load capacitor 25 will appear an output data signal $\overline{X}$.

Transistor 11 conducts during the period the clock pulse signal $\phi_1$ is active, i.e. at a $-V_C$ potential. When transistor 11 is not conducting, its resistance between the source electrode 14 and the drain electrode 12 thereof is very high and may be in the order of 100 megohms. During the time transistor 11 conducts its resistance between the drain and source electrodes thereof is relatively lower and may be in the order of 100K ohms. Transistor 20 conducts when the input signal X is active, i.e., at a $-V_X$ potential. When the semiconductor device 20 is not conducting, its resistance between drain and source electrodes is very high and may be in the order of 100 megohms. During the time the semiconductor device 20 conducts, its impedance or resistance between the drain and source electrodes thereof is considerably lower and may be on the order of 5K ohms.

Should the clock pulse signal $\phi_1$ be active while transistor is not conducting, the capacitor 25 will charge to $-V_D$ volts over the following path: source of $-V_D$ potential, conducting transistor 11, capacitor 25 and ground. The time required for the capacitor 25 to charge to $-V_D$ volts is proportional to the capacitance of capacitor 25 times the drain-source resistance of the conducting transistor 11.

When the data input signal impressed on the gate electrode 21 of the field-effect device 20 is active volts, the field-effect device 20 conducts and capacitor 25 discharges so that an ouput conductor 26 connected thereto will go to near ground potential. While discharging capacitor 25 to ground, transistor 20 must also draw current through transistor 11. The discharging time for capacitor 25 is thereby proportional to its capacitance times the drain-source resistance of MOST 20 while conducting. However the current flowing from transistor 11 through transistor 20 while capacitor 25 discharges acts against the discharge of capacitor 25, thereby increasing switching time.

According to the present invention, the load capacitor is precharged so that the current flowing from transistor 11 can be decreased to reduce the power consumption and to increase the switching speed.

Figure 2:
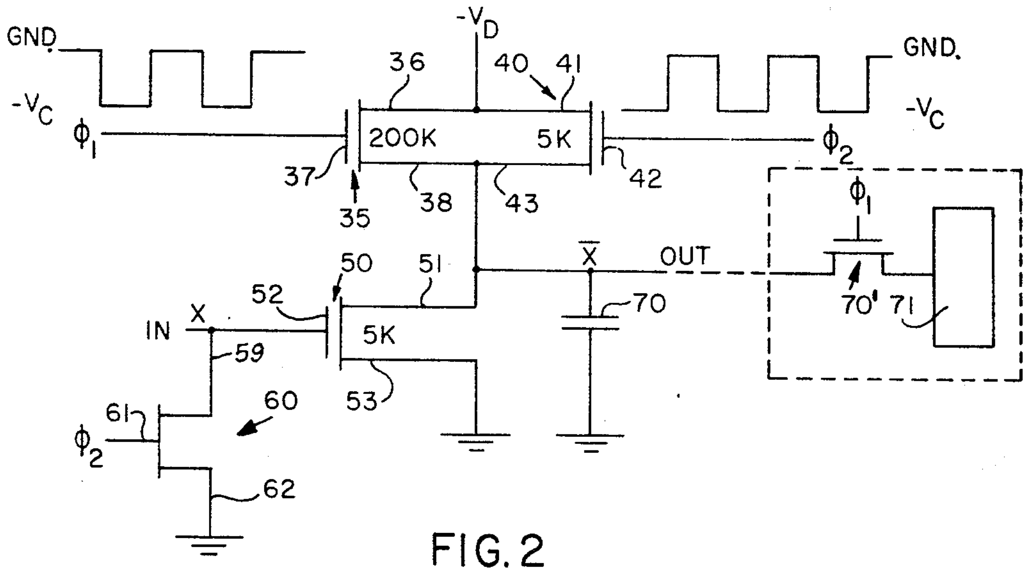
FIG. 2 is a diagrammatic illustration of a logic circuit embodying the present invention.

Illustrated in FIG. 2 is a logic circuit embodying the present invention, which comprises a load transistor 35 having a drain electrode 36, a gate electrode 37, and a source electrode 38. The drain electrode 36 is connected to a suitable source of voltage $-V_D$. The gate electrode 37 is connected to clock synchronizing pulses $\theta_1$ of an amplitude of $-V_C$. When the voltage impressed on the gate electrode 37 is at ground, transistor 35 can not conduct and the drain-source resistance of transistor 35 is relatively high and on the order of 100 megohms. On the other hand, when the voltage impressed on the gate electrode 37 is at a $-V_C$ volts, transistor 35 conducts and the drain-source resistance thereof is relatively lower and on the order of 200K ohms, or twice as high as that of transistor 11 of FIG. 1.

Connected in parallel with transistor 35 is a preload transistor 40, which comprises a drain electrode 41 connected to the source of potential $-V_D$, a gate electrode 42, and a source electrode 43. The gate electrode 42 is connected to a voltage source producing clock synchronizing pulses $\theta_2$ of an amplitude $-V_C$. The clock synchronizing pulses $\theta_2$ are 180° out of phase with the clock synchronizing pulses $\theta_1$ and time-wise for the purpose of the present discussion precedes the clock synchronizing pulses $\theta_1$. When the voltage impressed on gate electrode 42 is at ground, transistor 40 can not conduct and the drain-source resistance of the semiconductor device is relatively high and on the order of 100 megohms. However, when the voltage impressed on the gate electrode 42 is $-V_C$ volts, transistor 40 conducts and the drain-source resistance thereof is relatively lower and on the order of 5K ohms.

A logic data input metal oxide semiconductor field-effect device 50 is connected in series with the load transistor 35. The logic data transistor 50 comprises a drain electrode 51 connected in series with the course electrode 38 of the semiconductor device 35, a gate electrode 52 and a drain electrode 53 connected to ground. Impressed on the gate electrode 52 is a logical data input signal X. Transistor 50 can conduct when the input signal applied to the gate thereof is active. When transistor 50 conducts its resistance between the drain and source electrodes thereof is relatively low and on the order of 5K ohms. When the potential applied to gate electrode 52 is at ground, transistor 50 can not conduct. At this time its drain-source impedance or resistance is relatively high and on the order of 100 megohms.

Also connected to the gate electrode 52 of the field-effect device 50 is the drain electrode 59 of an inhibiting transistor 60. Transistor 60 also includes a gate electrode 61 and a source electrode 62. The clock synchronizing pulses $\theta_2$ are also applied to the gate electrode 61. The source electrode 62 is connected to ground. When the clock pulse $\theta_2$ applies a $-V_C$ potential to transistor 60 can conduct. As a consequence thereof, the gate electrode 52 of transistor 50 is grounded and MOST 50 cannot conduct. On the other hand, when the clock synchronizing pulses $\theta_2$ impress a ground potential on the gate electrode 61, transistor 60 cannot conduct and thereby transistor 50 can conduct.

From the foregoing, it is to be observed that the semiconductor devices 40 and 60 operate synchronously, since the conduction thereof is controlled by the clock synchronizing pulses $\theta_2$.

A capacitor 70, representing the load capacitance has one side thereof connected to the source electrode 43 of transistor 40 and also to the drain electrode 51 of transistor 50. The other side of capacitor 70 is connected to ground.

When transistor 40 conducts, capacitor 70 charges to the $-V_D$ potential over a path including source electrode 43, drain electrode 41 and the $-V_D$ source. Thus capacitor 70 will be precharged before transistor 30 conducts.

When transistor 50 conducts, capacitor 70 discharges over a path including drain electrode 51, source electrode 53, and ground. Transistor 50 cannot conduct until transistors 40 and 60 are non-conductive, and an "on" logical data input signal is impressed on the gate electrode 52 thereof. When the field-effect device 50 conducts, a logic data output signal $\overline{X}$ is supplied by the logic circuit. If no logic data input signal is supplied to gate electrode 52 there is no change in the output during the $\theta_1$ time of operation. Transistor 35 serves to supply the required drain current to maintain a negative output during the $\theta_1$ time of operation, rather than to supply charging current as does the load device 11 in circuit 10. Hence, transistor 35 can have a larger on resistance as that when capacitor 70 does discharge through transistor 50, the discharge will be more rapid since transistor 50 draws less current through transistor 35 than did the device 20 draw from the device 11 in FIG. 1.

Capacitor 70 may represent any combination of the following: (1) interface load capacitance between integral circuits, such as wiring capacitance; (2) any internal load capacitance within a single integral circuit; (3) or any load capacitance that an integral circuit output might see. It is to be understood that the devices 35, 40, 50 and 60 may be embodied in a single or integral semiconductor body or chip. In transferring logic signals from one logic circuit to another, the transistor had to operate with relatively slow switching time because of the load capacitance. The present invention has made the switching time more rapid by precharging load capacitor. Thus turn-on delay at the expense of the turn-off time can be minimized because turn-off delay during $\theta_1$ time has been eliminated.

In some applications it may become necessary to include an isolation or coupling transistor 70′ to isolate the transmitted logic signal from a succeeding stage 71 during $\phi_2$ time and to permit the reception of the transmitted logic signal during $\phi_1$ time. Transistor 70′ conducts at the same time as transistor 35 and is non-conductive while the preload transistor 40 conducts.

It is to be understood that modifications and variations of the embodiment of the invention disclosed herein may be resorted to without departing from the spirit of the invention and the scope of the appended claims.

While the present invention makes reference to an inverter circuit, it is apparent that the inventive concept is equally applicable to other logic and switching circuits such as NAND circuits, NOR circuits and the like.

Having thus described our invention, what we claim as new and desire to protect by Letters Patent is:

1. A logic circuit comprising a load transistor, means for impressing a first synchronizing signal on said load transistor for controlling the conduction thereof, a data input transistor connected to said load transistor, means for impressing a data signal on said data input transistor for controlling the conduction thereof, a load capacitance present at the connection of said data input transistor with said load transistor, a preload transistor connected to said connection, means for charging said load capacitance in response to said preload transistor conducting, and means for impressing a second synchronizing signal on said preload transistor for controlling the conduction thereof and for causing said preload transistor to conduct before said first synchronizing signal causes said load transistor to conduct.

2. A logic circuit comprising a load field-effect transistor with a gate electrode, means for impressing a clock pulse signal on said gate electrode of said load transistor for controlling the conduction thereof, a data input field-effect transistor with a gate electrode, said data input transistor being connected to said load transistor, means for impressing a signal on the gate electrode of said data input transistor for controlling the conduction thereof, a capacitance present at the connection of said data input transistor with said load transistor, and preload means connected to said connection for charging said load capacitance prior to said load device conducting under the control of said clock pulse signal.

3. A logic circuit comprising a load field-effect transistor with a gate electrode, means for impressing a first clock pulse signal on the gate electrode of said load transistor for controlling the conduction thereof, a data input field-effect transistor having a gate electrode, means for impressing a logic signal on the gate electrode of said data input transistor for controlling the conduction thereof, a load capacitance present at the connection of said data input transistor with said load transistor, a preload field-effect transistor having a gate electrode, said preload transistor being connected to said connection for charging said load capacitance in response to conduction through said preload transistor, an inhibiting field-effect transistor with a gate electrode, said inhibiting transistor being connected to the gate electrode of said data input transistor for controlling the conduction thereof, said data input transistor being capable of conducting while said inhibiting transistor is non-conductive, and means for impressing a second clock pulse signal on the gate electrodes of said preload and said inhibiting transistors for controlling the conduction thereof, said second clock pulse signal being arranged to cause said preload transistor to conduct to charge said load capacitance and to cause said inhibiting transistor to conduct to render said data input transistor non-conductive, whereby said load capacitance will be charged before said first clock pulse signal causes said load transistor to conduct.

4. A logic circuit comprising a load transistor, means for impressing a first synchronizing signal on said load transistor for controlling the conduction thereof, a data input transistor connected to said load transistor, means for impressing a data signal on said data input transistor for controlling the conduction thereof, a load capacitance present at the connection of said data input transistor with said load transistor, a preload transistor connected to said connection for charging said load capacitance in response to said preload transistor conducting, means for impressing a second synchronizing signal on said preload transistor for controlling the conduction thereof and for causing said preload transistor to conduct before said first synchronizing signal causes said load transistor to conduct, circuit means for receiving an output signal provided at said connection and isolating means connected to said circuit means for rendering the same non-conductive while said preload device is conducting.

5. A logic circuit comprising a load field-effect transistor with a gate electrode, a source electrode, and a drain electrode, means for impressing a first clock pulse signal on the gate electrode of said load transistor for controlling the conduction thereof, a data input field-effect transistor with a gate electrode, a source electrode, and a drain electrode, said source electrode of said load transistor being connected to the drain electrode of said data input transistor, means for impressing a signal on the gate electrode of said data input transistor for controlling the conduction thereof, a preload field-effect transistor with a gate electrode, a drain electrode, and a source electrode, a load capacitance present at the connection of said drain electrode of said data input transistor with said source electrode of said load transistor, and said source electrode of said preload transistor, an inhibiting field-effect transistor having a gate electrode, a source electrode, and a drain electrode, the drain electrode of said inhibiting transistor being connected to the gate electrode of said logic data input transistor to render said logic data input device non-conductive while said inhibiting transistor conducts, means for impressing a second clock pulse signal on the gate electrodes of said preload and said inhibiting transistors for controlling the conduction thereof, said second and first clock pulses being out of phase, whereby the simultaneous conduction of said inhibiting and said preload transistors will render said data input device non-conductive and charge said load capacitance, so that load capacitance will discharge through said logic data input transistor in response to said logic data input device conducting, said data input transistor being arranged to conduct when said inhibiting device is rendered non-conductive and a predetermined logic signal is impressed on the gate electrode of said data input transistor so that said load capacitor will be charged before said first clock pulse signal causes said load transistor to conduct, circuit means for receiving an output signal present at said connection, an isolating field-effect transistor with a gate electrode, said isolating field-effect transistor interconnecting said circuit means with said connection, and means for impressing said first clock pulse signal on the gate electrode of said isolating transistor for rendering said circuit means operative to receive an output signal while said load transistor conducts and for isolating said circuit means from said load capacitance while said preload transistor conducts.

References Cited

UNITED STATES PATENTS

| | | | |
|---|---|---|---|
| 3,100,838 | 8/1963 | Szekely | 307—88.5 X |
| 3,309,534 | 3/1967 | Yu et al. | 307—88.5 |

ARTHUR GAUSS, *Primary Examiner.*

D. D. FORRER, *Assistant Examiner.*